United States Patent
Wu et al.

(10) Patent No.: US 9,612,461 B2
(45) Date of Patent: Apr. 4, 2017

(54) ARRAY SUBSTRATE, METHOD FOR REPAIRING BROKEN LINE OF THE ARRAY SUBSTRATE, AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Song Wu, Beijing (CN); Jieqiong Bao, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 1 day.

(21) Appl. No.: 14/372,848

(22) PCT Filed: Nov. 27, 2013

(86) PCT No.: PCT/CN2013/087962
§ 371 (c)(1),
(2) Date: Jul. 17, 2014

(87) PCT Pub. No.: WO2014/187097
PCT Pub. Date: Nov. 27, 2014

(65) Prior Publication Data
US 2015/0185513 A1    Jul. 2, 2015

(30) Foreign Application Priority Data
May 24, 2013 (CN) .......................... 2013 1 0198549

(51) Int. Cl.
*H01L 27/14* (2006.01)
*G02F 1/13* (2006.01)
(Continued)

(52) U.S. Cl.
CPC .......... *G02F 1/1309* (2013.01); *G02F 1/1368* (2013.01); *G02F 1/134309* (2013.01);
(Continued)

(58) Field of Classification Search
CPC ............. G02F 1/1309; G02F 1/134309; G02F 1/134363; G02F 1/1368; G02F 1/136259; G02F 1/136286
See application file for complete search history.

(56) References Cited

U.S. PATENT DOCUMENTS

2004/0125300 A1* 7/2004 Lee ................... G02F 1/134363
349/141
2006/0268206 A1* 11/2006 Nishimura ........ G02F 1/134363
349/114

(Continued)

FOREIGN PATENT DOCUMENTS

CN    103278987 A    9/2013

OTHER PUBLICATIONS

PCT International Search Report in International Application No. PCT/CN2013/087962, dated Jun. 6, 2014; 14 pages.
(Continued)

*Primary Examiner* — Marc Armand
*Assistant Examiner* — Sarah Salerno
(74) *Attorney, Agent, or Firm* — Banner & Witcoff, Ltd.

(57) ABSTRACT

An array substrate, a method for repairing broken line of the array substrate, and a display device are provided. The array substrate comprises: a gate line (2) and a data line (5) intersecting with each other to define a plurality of pixel regions arranged in a matrix form; a thin film transistor (11*a*) disposed in the vicinity of an intersection of the gate line (2) and the data line (5), a gate electrode (2') of the thin film transistor (11*a*) being connected to the gate line (2), and a source electrode of the thin film transistor (11*a*) being
(Continued)

connected to the data line (5); a common electrode (8) and a pixel electrode (6) disposed in each pixel region. The common electrode (8) is provided with a plurality of patterns of strip hole structure (8a) patterns respectively above each pixel region, the gate line (2), the data line (5) and the common electrode (8) are fabricated on different layers and partially overlap each other, and the common electrode (8) is provided with a pattern of a first hole structure (12) at a corresponding position of the intersection of the gate line (2) and the data line (5).

20 Claims, 6 Drawing Sheets

(51) Int. Cl.
  *G02F 1/1343* (2006.01)
  *G02F 1/1362* (2006.01)
  *G02F 1/1368* (2006.01)
  *H01L 27/12* (2006.01)
(52) U.S. Cl.
  CPC .. *G02F 1/134363* (2013.01); *G02F 1/136259* (2013.01); *G02F 1/136286* (2013.01); *H01L 27/124* (2013.01); *H01L 27/1259* (2013.01); *G02F 2001/134318* (2013.01); *G02F 2001/136263* (2013.01); *G02F 2201/121* (2013.01)

(56) References Cited

U.S. PATENT DOCUMENTS

| | | | | |
|---|---|---|---|---|
| 2006/0279677 | A1* | 12/2006 | Matsushima | G02F 1/134363 349/114 |
| 2007/0195250 | A1* | 8/2007 | Onogi | G02F 1/134363 349/141 |
| 2008/0186440 | A1* | 8/2008 | Lim | G02F 1/134363 349/141 |
| 2010/0007837 | A1* | 1/2010 | Ham | G02F 1/134309 349/139 |

OTHER PUBLICATIONS

English Abstract of CN103278987A; 1 page.
Nov. 24, 2015—International Preliminary Report on Patentability Appn PCT/CN2013/087962.

* cited by examiner

ARRAY SUBSTRATE, METHOD FOR REPAIRING BROKEN LINE OF THE ARRAY SUBSTRATE, AND DISPLAY DEVICE

CROSS REFERENCE TO RELATED APPLICATIONS

This application is based on International Application No. PCT/CN2013/087962 filed on Nov. 27, 2013, which claims priority to Chinese National Application No. 2013/0198549.1 filed on May 24, 2013. The entire contents of each and every foregoing application are incorporated herein by reference.

TECHNICAL FIELD

Embodiments of the present invention relates to an array substrate, a method for repairing broken line of the array substrate, and a display device.

BACKGROUND

In a fabrication process of a liquid crystal display panel, repairing a broken line is an important means to improve yield. It is common in the prior art to lay a structure of data repairing lines around the liquid crystal display panel, to facilitate repairing a broken gate line.

An Advanced-Super Dimensional Switching (ADS) type liquid crystal display panel forms a multidimensional electric field by a parallel electric field generated at edges of a pixel electrode or a common electrode in the same plane and a longitudinal electric field generated between the pixel electrode and the common electrode, such that all alignment crystal molecules between the pixel electrodes or the common electrodes in a liquid crystal box and right above the pixel electrodes or the common electrodes can generate a rotary conversion, thereby improving operation efficiency of the liquid crystal of a plane alignment system and enhancing light transmission efficiency. The ADS-type liquid crystal display panel can improve picture quality of a Thin Film Transistor Liquid Crystal Display (TFT-LCD), and has advantages such as high transmittance, wide viewing angle, high aperture opening ratio, low chromatic aberration, low response time, and no Push Mura, etc.

In a current method for repairing a broken data line of an array substrate, for example, a broken line repairing line 9 is mostly used to repair a data line 15, as illustrated in FIG. 1. For the data line 15 having a broken data line 13, both ends of the data line 15 are connected with the broken line repairing line 9 at a broken data line repairing location 31 by using laser welding, and then the data line 15 obtains a correct signal through the broken line repairing line 9. However, when the array substrate is repaired using such method, only a limited number of data lines can be repaired due to a limited number of 9 broken line repairing lines, generally broken lines of two data lines can be repaired at most. Moreover, currently there is no mature method for repairing a broken gate line. If an array substrate broken line cannot be effectively repaired, the yield of liquid crystal display products will be affected.

SUMMARY OF THE INVENTION

An embodiment of the invention provides an array substrate, comprising:

a gate line and a data line intersecting with each other to define a plurality of pixel regions arranged in a matrix form;

a thin film transistor disposed in a vicinity of an intersection of the gate line and the data line, a gate electrode of the thin film transistor being connected to the gate line, and a source electrode of the thin film transistor being connected to the data line;

a common electrode and a pixel electrode disposed in each pixel region, wherein the common electrode is provided with a plurality of patterns of strip hole structure respectively above each pixel region, the gate line, the data line and the common electrode are fabricated on different layers and partially overlap each other, and the common electrode is provided with a pattern of a first hole structure at a position corresponding to the intersection of the gate line and the data line.

In one example, the common electrode is provided with a pattern of a second hole structure right above the thin film transistor, the second hole structure is correspondingly disposed above the gate line, and is located between two adjacent first hole structures.

In one example, the common electrode is a transparent conductive layer.

In one example, the first hole structure has a dimension in a width direction of the data line larger than a width of the data line, and protrudes to both sides of the data line.

In one example, the second hole structure has a dimension in a width direction of the gate line larger than a width of the gate line, and protrudes to both sides of the data line; the first hole structure has a dimension in a width direction of the gate line larger than the width of the gate line, and protrudes to both sides of the gate line.

In one example, the common electrode is located above the pixel electrode, and the common electrode and the pixel electrode overlap each other with an insulating layer interposed therebetween.

In one example, a plurality of pixel electrodes located independently of each other in each pixel region, and the pixel electrode does not overlap with the gate line and the data line.

Another embodiment provides a method for repairing a broken data line of any one of the array substrates as mentioned above, comprising steps of:

step F1: locating a broken site of the data line, and determining a part of the data line between two first hole structure regions adjacent to the broken site of the data line as a broken data line segment;

step F2: cutting a common electrode located above the broken data line segment along both sides of the data line to the two first hole structure regions adjacent to the broken data line segment, so that the common electrode disposed right above the broken data line segment is isolated from other regions of the common electrode, to form an isolated transparent conductive layer region;

step F3: respectively welding the isolated transparent conductive layer region with the broken data line segment at both ends of the broken site of the data line, so that the broken data line transmits a signal through the isolated transparent conductive layer region.

In one example, in step F2, the common electrode above the broken data line segment is cut by using a laser cutting method.

In one example, in step F3, the isolated transparent conductive layer region is welded with the broken data line segment through forming a melting point by using a laser welding method.

Still another embodiment provides a method for repairing a broken gate line of any one of the array substrates as mentioned above, comprising steps of:

step S1: locating a broken site of the gate line, and determining a part of the gate line between a first hole structure and a second hole structure adjacent to the gate line as a broken gate line segment;

step S2: cutting a common electrode located above the broken gate line segment along both sides of the gate line to the first hole structure region and the second hole structure region adjacent to the broken gate line segment, so that the common electrode disposed right above the broken gate line segment is isolated from other regions of the common electrode, to form an isolated transparent conductive layer region;

step S3: respectively welding the isolated transparent conductive layer region with the broken gate line segment at both ends of the broken site of the gate line, so that the broken gate line transmits a signal through the isolated transparent conductive layer region.

In one example, in step S2, the common electrode above the broken gate line segment is cut by using a laser cutting method.

In one example, in step S3, the isolated transparent conductive layer region is welded with the broken gate line segment through forming a melting point by using a laser welding method.

Further, still another embodiment provides a display device, comprising any one of the array substrates as mentioned above.

The embodiments of the present invention, by disposing a hollow structure on the common electrode of the array substrate, easily and quickly repair the data line and the broken gate lines on the array substrate, and repairing of the broken data line overcomes limitation to the number of lines, which effectively improves product yield of the array substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

This embodiment provides an array substrate, e.g., a High Aperture Ratio-ADS (HADS) type or an Advanced-Super Dimensional Switching (ADS) type liquid crystal array substrate, as illustrated in FIG. 2, FIG. 3, FIG. 4 and FIG. 5, comprising a common electrode 8, a pixel electrode 6, a gate line 2 and a data line 5. The gate line 2 and the data line 5 are overlapped with the common electrode 8 thereabove. The gate line 2 and the data line 5 intersect with each other to form a plurality of pixel regions arranged in a matrix form. The common electrode 8 is provided with a plurality of patterns of strip hole structure 8a respectively above each pixel region; the gate line 2, the data line 5 and the common electrode 8 are fabricated on different layers and partially overlap each other, and the common electrode 8 is provided with a pattern of first hole structure 12 at a corresponding intersection of the gate line 2 and the data line 5. Through the first hole structure 12, the broken data line and the broken gate line of the array substrate can be repaired, and repairing of the broken data lines is not limited by the number of lines. The gate line 2 and a gate electrode 2' are connected to each other, and are fabricated on the same layer with the same material.

Figure 1:
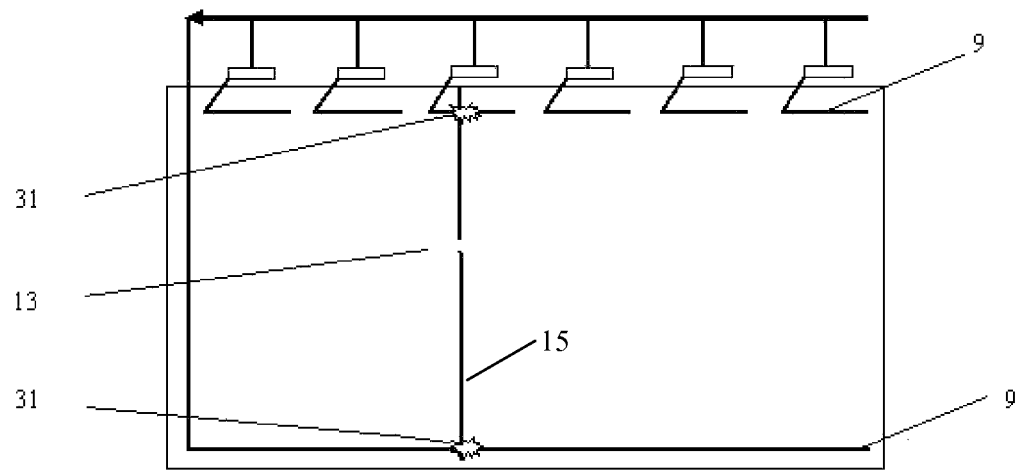
FIG. 1 is a structural schematic diagram of an existing array substrate after a broken data line is repaired.
Figure 2:
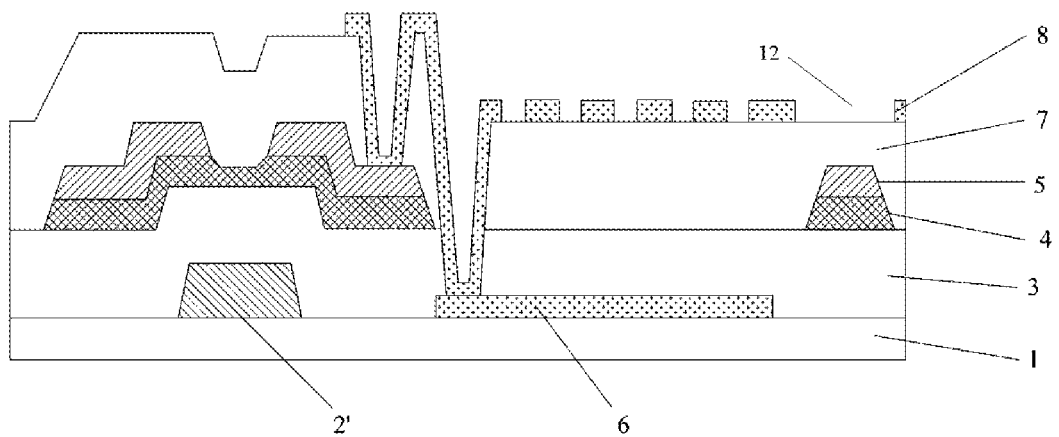
FIG. 2 is a pixel cross-section structural diagram of an ADS-type array substrate according to an embodiment of the present invention.
Figure 3:
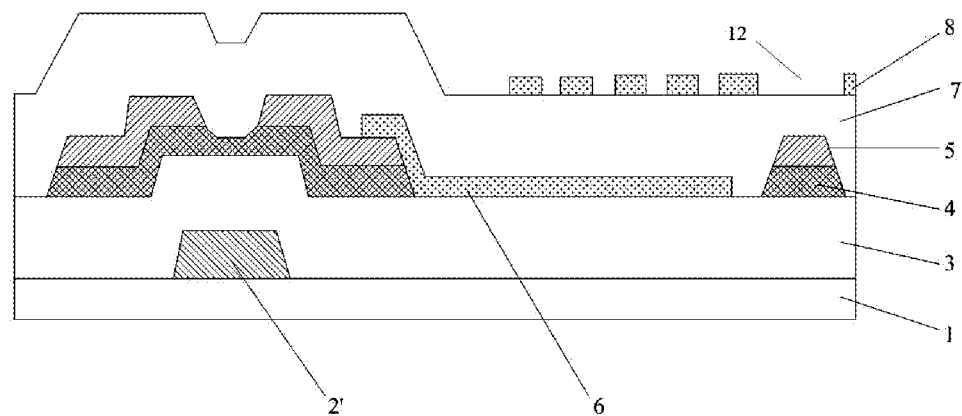
FIG. 3 is a pixel cross-section structural diagram of another ADS-type array substrate according to an embodiment of the present invention.
Figure 4:
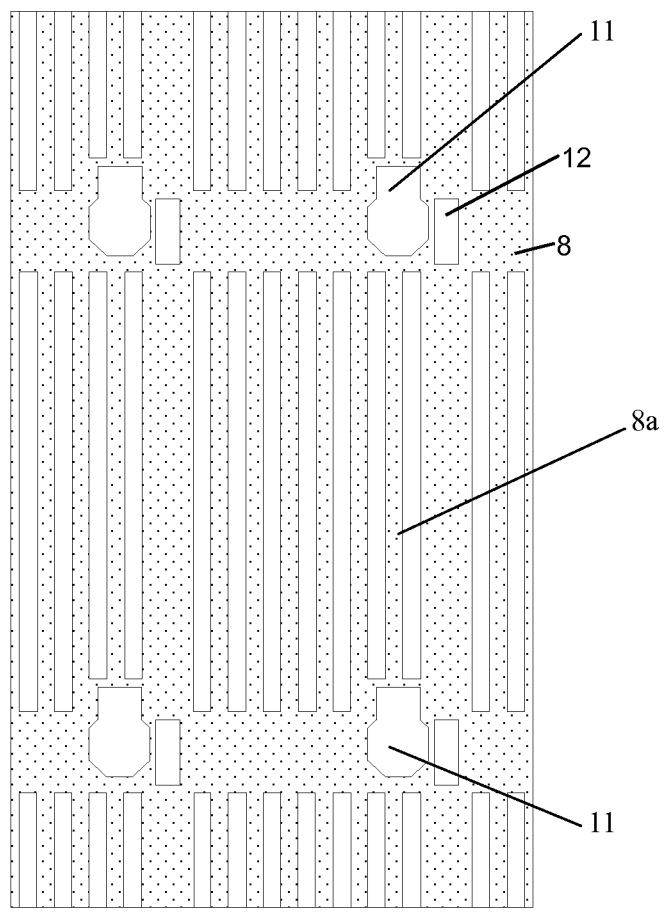
FIG. 4 is a structural diagram of a common electrode of an ADS-type array substrate according to an embodiment of the present invention.

FIG. 2 and FIG. 3 illustrate cross-sectional schematic diagrams based on an HADS-type liquid crystal array substrate. As illustrated in FIG. 2 or FIG. 3, the HADS-type array substrate comprises a substrate 1, a gate electrode 2', a gate insulating layer 3, a semiconductor layer 4, a data line 5, a pixel electrode 6, a protective layer 7 and a common electrode 8. Both the pixel electrode 6 and the common electrode 8 are transparent conductive layers, and both the gate line 2 and the data line 5 are overlapped with the common electrode 8 thereabove. The structural difference between FIG. 2 and FIG. 3 lies in that the structure in FIG. 2 is a pixel electrode connected to a drain electrode of a thin film transistor through a via-hole structure, while the structure in FIG. 3 is a pixel electrode connected directly to a drain electrode of a thin film transistor. FIG. 2 and FIG. 3 are intercepted in parallel with and in the vicinity of the gate line, so the two cross-sectional diagrams do not illustrate any portion of the gate line (only illustrate the gate electrode 2' connected to the gate line 2).

It can be seen from FIG. 2 and FIG. 3 that the common electrode 8 is located above the pixel electrode 6 and the former and the latter overlap each other with an insulating layer interposed therebetween, so that an electric field can be formed between them. The plurality of pixel electrodes 6 may be located independently of each other in each pixel region, without overlapping with the gate line 2 and the data line 5. However, the embodiments of the present invention are not limited to such a structure.

In one example, a thin film transistor 11a is disposed in the vicinity of an intersection of the gate line and the data line, a gate electrode of the thin film transistor is connected to the gate line, and a source electrode of the thin film transistor is connected to the data line. The common electrode and the pixel electrode are disposed in each pixel region.

In one example, the first hole structure 12 has a dimension in a width direction of the data line larger than the width of the data line 5, and protrudes to both sides of the data line 5. Therefore, during a process of repairing the data line, when the common electrode between the adjacent first hole structures is isolated from other regions of the common electrode, an isolated transparent conductive layer of a sufficient width will be retained above the data line at the broken line to repair the data line (the method for repairing the data line will be described hereinafter).

The common electrode 8 is provided with a pattern of second hole structure 11 right above a thin film transistor 11a, and the second hole structure 11 is correspondingly disposed above the gate line 2, and between two adjacent first hole structures 12 along the direction of the gate line.

In one example, the second hole structure 11 has a dimension in a width direction of the gate line larger than the width of the gate line 2, and protrudes to both sides of the gate line 2; and the first hole structure 12 has a dimension in a width direction of the gate line larger than the width of the gate line 2, and protrudes to both sides of the gate line 2. At this time, during a process of repairing the gate line, when the common electrode between the adjacent first hole structure and the second hole structure is isolated from other regions of the common electrode, an isolated transparent conductive layer of a sufficient width will be retained above the gate line at the broken line to repair the gate lime (the method for repairing the gate line will be described hereinafter).

The common electrode of the array substrate is a transparent conductive layer, which may be a transparent metal oxide layer, such as ITO or IZO materials.

Figure 5:
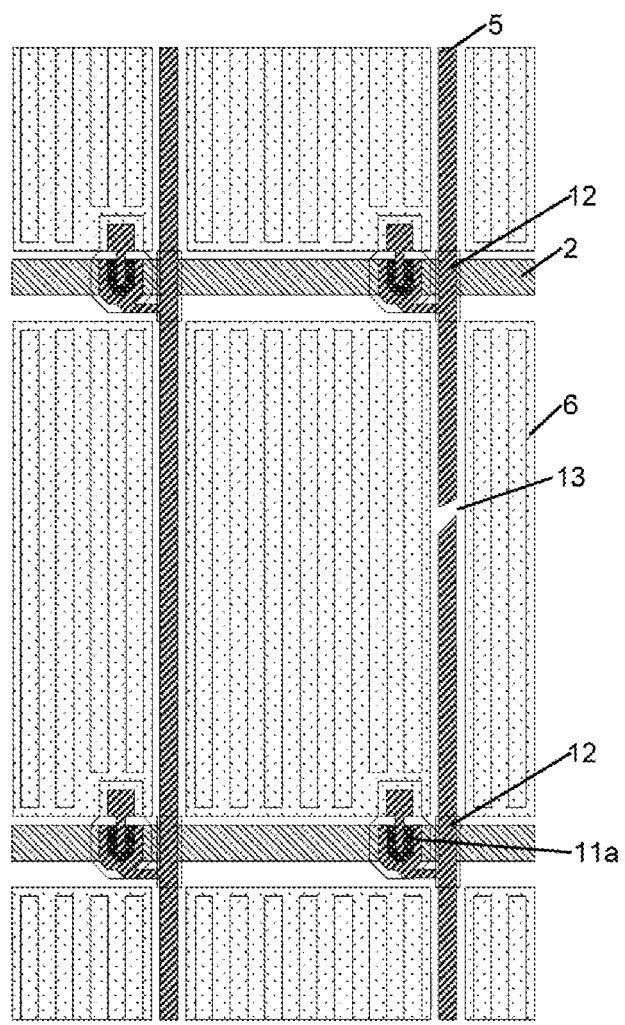
FIG. 5 is a structural diagram of a broken data line of an ADS-type array substrate according to an embodiment of the present invention.
Figure 6:
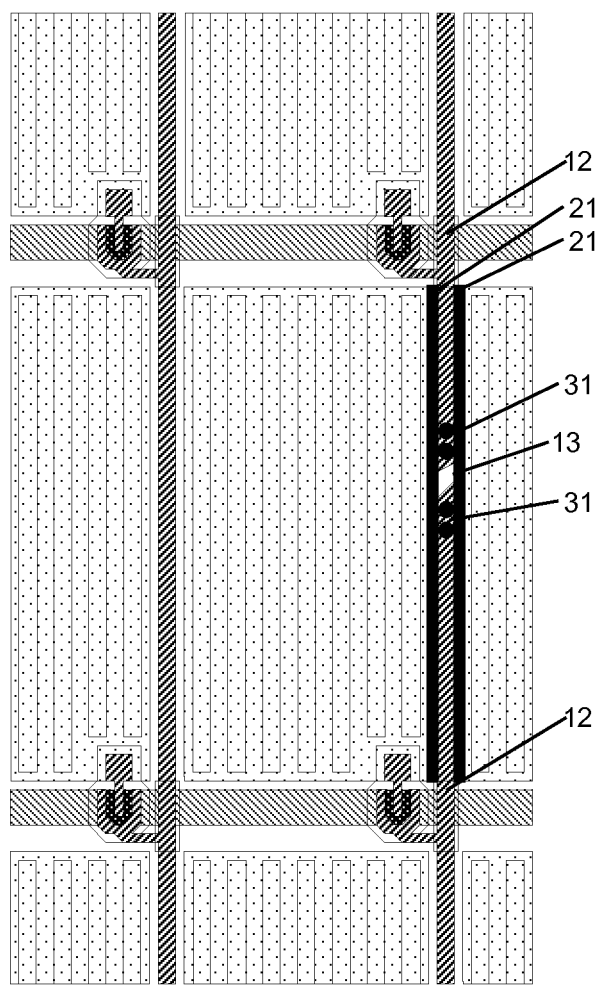
FIG. 6 is a structural schematic diagram of an ADS-type array substrate according to an embodiment of the present invention after a broken data line is repaired.

This embodiment provides a method for repairing a broken data line of any of the above-described array substrates, comprising steps of:

Step F1: locating a broken site 13 of the data line, as illustrated in FIG. 5, and determining a part of the data line between two first hole structure 12 adjacent to the broken data line 13 as a broken data line segment;

Step F2: as illustrated in FIG. 6, cutting the common electrode 8 located above the broken data line segment along both sides of the data line 5 to the two first hole structure 12 adjacent to the broken data line segment, i.e., cutting off the common electrode at a broken data line repairing and cutting location 21, so that the common electrode disposed right above the broken data line segment is isolated from other regions on the common electrode, to form an isolated transparent conductive layer region;

Step F3: respectively welding the isolated transparent conductive layer region with the broken data line segment at both ends of the broken site 13 of the data line, i.e., welding at the broken data line repairing and welding location 31 as illustrated in FIG. 6, so that the broken data line 5 transmits a signal through the isolated transparent conductive layer region, so as to achieve an aim to repair the broken data line.

In step F1, an inspection device, such as a lighting device, is used to locate coordinates of the broken data line 13 by manual operation, or an inspection device is used to automatically locate the coordinates of the broken data line 13, and then locate the specific broken data line 13 under a microscope, some repairing devices with a lighting function may be further used to directly find the broken data line 13 by a lighting device. Further, in step F2, the common electrode above the broken data line segment is cut by using a laser cutting method. In step F3, the isolated transparent conductive layer region is welded with the broken data line segment through forming a melting point by using a laser welding method.

Figure 7:
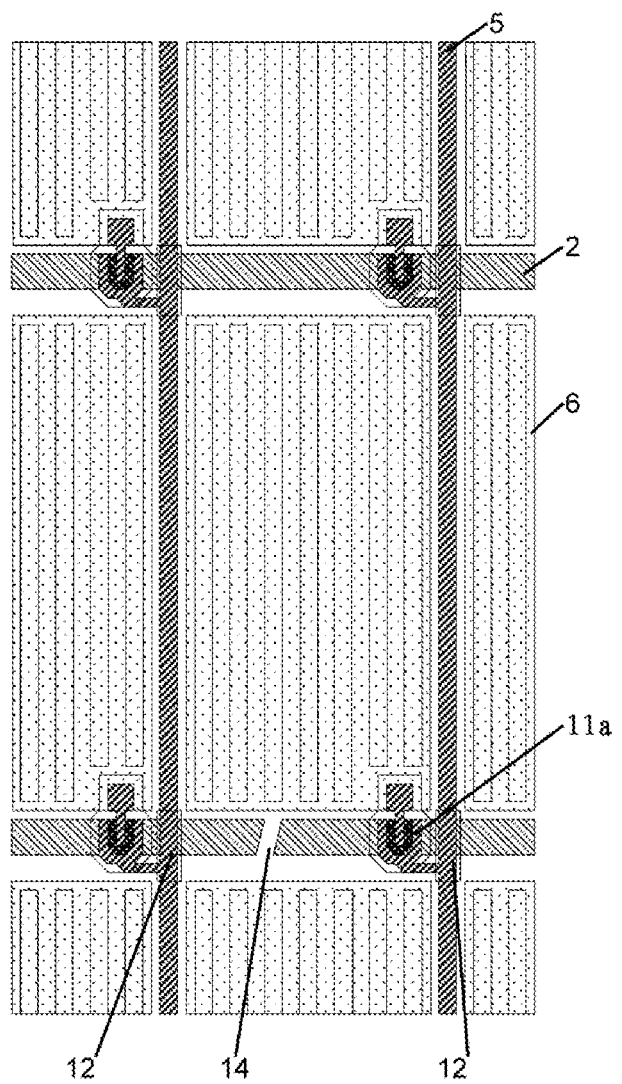
FIG. 7 is a structural diagram of a broken gate line of an ADS-type array substrate according to an embodiment of the present invention.
Figure 8:
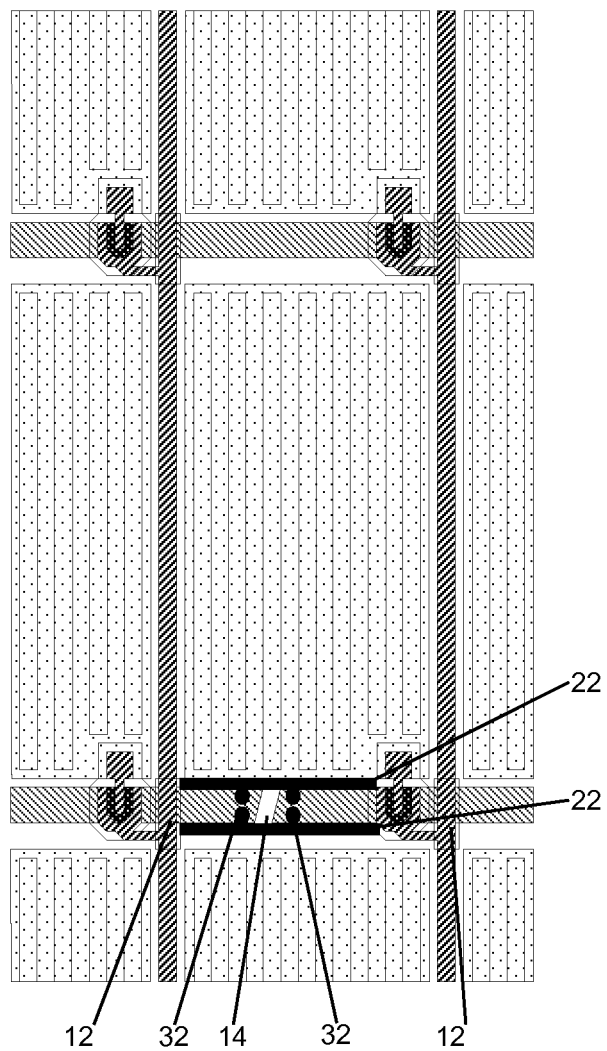
FIG. 8 is a structural schematic diagram of an ADS-type array substrate according to an embodiment of the present invention after a broken gate line is repaired.

Moreover, this embodiment further provides a method for repairing a broken gate line of any of the above-described array substrates, comprising steps of:

Step S1: as illustrated in FIG. 7, locating the broken site 14 of the gate line, and determining a part of the gate line between the first hole structure 12 and the second hole structure 11a adjacent to the broken gate line 14 as a broken gate line segment;

Step S2: as illustrated in FIG. 8, cutting a common electrode 8 located above the broken gate line segment along both sides of the gate line to a region of the first hole structure 12 and a region of the second hole structure 11 adjacent to the broken gate line segment, i.e., cutting off the common electrode at the broken gate line repairing and cutting location 22, so that the common electrode disposed right above the broken gate line segment is isolated from other regions on the common electrode, to form an isolated transparent conductive layer region;

Step S3: respectively welding the isolated transparent conductive layer region with the broken gate line segment at both ends of the broken site 14 of the gate line, i.e., welding at a broken gate line repairing and welding location 32 as illustrated in FIG. 8, so that the broken gate line transmits a signal through the isolated transparent conductive layer region, so as to achieve an aim to repair the broken gate line.

In step S1, the broken site 14 of the gate line is located by an inspection device or in other modes. Further, in step F2, the common electrode 8 above the broken gate line segment is cut by using a laser cutting method. And in step F3, the isolated transparent conductive layer region is welded with the broken gate line segment at both ends of the broken site 14 of the gate line by using a laser welding mode.

This embodiment further provides a display device, comprising the above-described array substrate, and the display device may be any product or component with a display function such as a liquid crystal panel, an e-paper, an Organic Light Emitting Diode (OLED) panel, a mobile phone, a liquid crystal display, or a tablet personal computer, etc.

The foregoing embodiments merely are exemplary embodiments of the invention, and not intended to define the scope of the invention, and the scope of the invention is determined by the appended claims.

What is claimed is:

1. An array substrate, comprising:
   a gate line and a data line intersecting with each other to define a plurality of pixel regions arranged in a matrix form;
   a thin film transistor disposed in a vicinity of an intersection of the gate line and the data line, a gate electrode of the thin film transistor being connected to the gate line, and a source electrode of the thin film transistor being connected to the data line; and
   a common electrode and a pixel electrode disposed in each pixel region,
   wherein the common electrode is provided with a plurality of patterns of strip hole structure respectively above each pixel region, the gate line, the data line and the common electrode are fabricated on different layers and partially overlap each other, and the common electrode is provided with a pattern of a first hole structure at the intersection of the gate line and the data line.

2. The array substrate according to claim 1, wherein, the common electrode is provided with a pattern of a second hole structure right above the thin film transistor, the second hole structure is correspondingly disposed above the gate line, and is located between two adjacent first hole structures.

3. The array substrate according to claim 1, wherein, the common electrode is a transparent conductive layer.

4. The array substrate according to claim 1, wherein, the first hole structure has a dimension in a width direction of the data line larger than a width of the data line, and protrudes to both sides of the data line.

5. The array substrate according to claim 2, wherein, the second hole structure has a dimension in a width direction of the gate line larger than a width of the gate line, and protrudes to both sides of the data line; the first hole structure has a dimension in a width direction of the gate line larger than the width of the gate line, and protrudes to both sides of the gate line.

6. The array substrate according to claim 1, wherein, the common electrode is located above the pixel electrode, and the common electrode and the pixel electrode overlap each other with an insulating layer interposed therebetween.

7. The array substrate according to claim 1, wherein, a plurality of pixel electrodes located independently of each other in each pixel region, and the pixel electrode does not overlap with the gate line and the data line.

8. A method for repairing a broken data line of the array substrate according to claim 1, comprising steps of:
step F1: locating a broken site of the data line, and determining a part of the data line between two first hole structure regions adjacent to the broken site of the data line as a broken data line segment;
step F2: cutting a common electrode located above the broken data line segment along both sides of the data line to the two first hole structure regions adjacent to the broken data line segment, so that the common electrode disposed right above the broken data line segment is isolated from other regions of the common electrode, to form an isolated transparent conductive layer region; and
step F3: respectively welding the isolated transparent conductive layer region with the broken data line segment at both ends of the broken site of the data line, so that the broken data line transmits a signal through the isolated transparent conductive layer region.

9. The method for repairing the broken data line of the array substrate according to claim 8, wherein, in step F2, the common electrode above the broken data line segment is cut by using a laser cutting method.

10. The method for repairing the broken data line of the array substrate according to claim 8, wherein, in step F3, the isolated transparent conductive layer region is welded with the broken data line segment through forming a melting point by using a laser welding method.

11. A method for repairing a broken gate line of the array substrate according to claim 2, comprising steps of:
step S1: locating a broken site of the gate line, and determining a part of the gate line between a first hole structure and a second hole structure adjacent to the gate line as a broken gate line segment;
step S2: cutting a common electrode located above the broken gate line segment along both sides of the gate line to a first hole structure region and a second hole structure region adjacent to the broken gate line segment, so that the common electrode disposed right above the broken gate line segment is isolated from other regions of the common electrode, to form an isolated transparent conductive layer region; and
step S3: respectively welding the isolated transparent conductive layer region with the broken gate line segment at both ends of the broken site of the gate line, so that the broken gate line transmits a signal through the isolated transparent conductive layer region.

12. The method for repairing the broken gate line of the array substrate according to claim 11, wherein, in step S2, the common electrode above the broken gate line segment is cut by using a laser cutting method.

13. The method for repairing the broken gate line of the array substrate according to claim 11, wherein, in step S3, the isolated transparent conductive layer region is welded with the broken gate line segment through forming a melting point by using a laser welding method.

14. A display device, comprising the array substrate according to claim 1.

15. The array substrate according to claim 2, wherein, the common electrode is a transparent conductive layer.

16. The array substrate according to claim 2, wherein, the first hole structure has a dimension in a width direction of the data line larger than a width of the data line, and protrudes to both sides of the data line.

17. The array substrate according to claim 2, wherein, the common electrode is located above the pixel electrode, and the common electrode and the pixel electrode overlap each other with an insulating layer interposed therebetween.

18. The array substrate according to claim 2, wherein, a plurality of pixel electrodes located independently of each other in each pixel region, and the pixel electrode does not overlap with the gate line and the data line.

19. The method for repairing the broken data line of the array substrate according to claim 9, wherein, in step F3, the isolated transparent conductive layer region is welded with the broken data line segment through forming a melting point by using a laser welding method.

20. The method for repairing the broken gate line of the array substrate according to claim 12, wherein, in step S3, the isolated transparent conductive layer region is welded with the broken gate line segment through forming a melting point by using a laser welding method.

* * * * *